(12) United States Patent
Sher

(10) Patent No.: US 6,507,235 B1
(45) Date of Patent: *Jan. 14, 2003

(54) LOCAL SUBSTRATE PUMPING IN INTEGRATED CIRCUITS

(75) Inventor: Joseph C. Sher, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 906 days.

(21) Appl. No.: 08/666,618

(22) Filed: Jun. 18, 1996

(51) Int. Cl.[7] .................................................. H03K 3/01
(52) U.S. Cl. ...................................... 327/534; 327/564
(58) Field of Search ................................ 257/299, 372; 327/530, 534, 564–566; 365/189.9

(56) References Cited

U.S. PATENT DOCUMENTS

| | | | | |
|---|---|---|---|---|
| 5,386,135 A | * | 1/1995 | Nakazato et al. | 257/369 |
| 5,394,365 A | * | 2/1995 | Tsukikawa | 327/534 |
| 5,473,183 A | * | 12/1995 | Yonemoto | 257/372 |
| 5,491,359 A | * | 2/1996 | May et al. | 257/372 |
| 5,497,023 A | * | 3/1996 | Nakazato et al. | 257/372 |
| 5,559,356 A | * | 9/1996 | Yukawa | 257/372 |
| 5,917,354 A | * | 6/1999 | Nakai et al. | 327/198 |

* cited by examiner

Primary Examiner—Kenneth B. Wells
(74) Attorney, Agent, or Firm—Fletcher, Yoder & Van Someren

(57) ABSTRACT

A method is disclosed wherein the voltage of a semiconducting substrate can be locally pumped to a voltage different than the bulk of the semiconducting substrate generally. The local voltage may be pumped into a localized portion of the bulk substrate, or it may be pumped into a portion of the substrate that is isolated from the bulk substrate. This localized biasing may be used for various purposes, including the adjustment of body effect in a plurality of transistors, adjusting the threshold voltage of a capacitor, and reducing latch-up sensitivity of a transistor circuit.

44 Claims, 5 Drawing Sheets

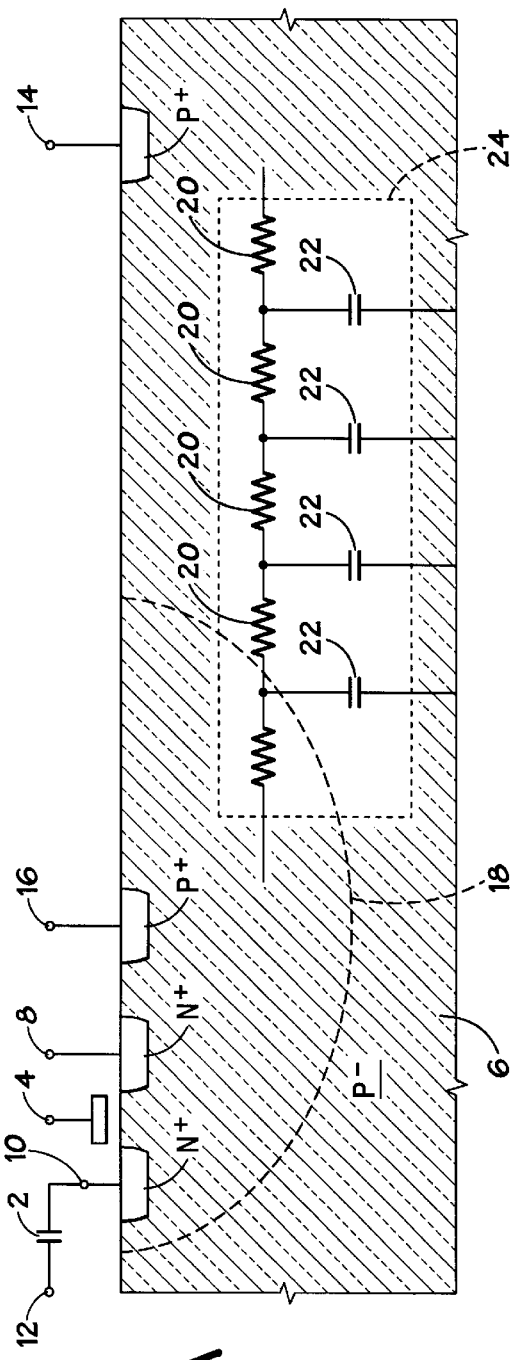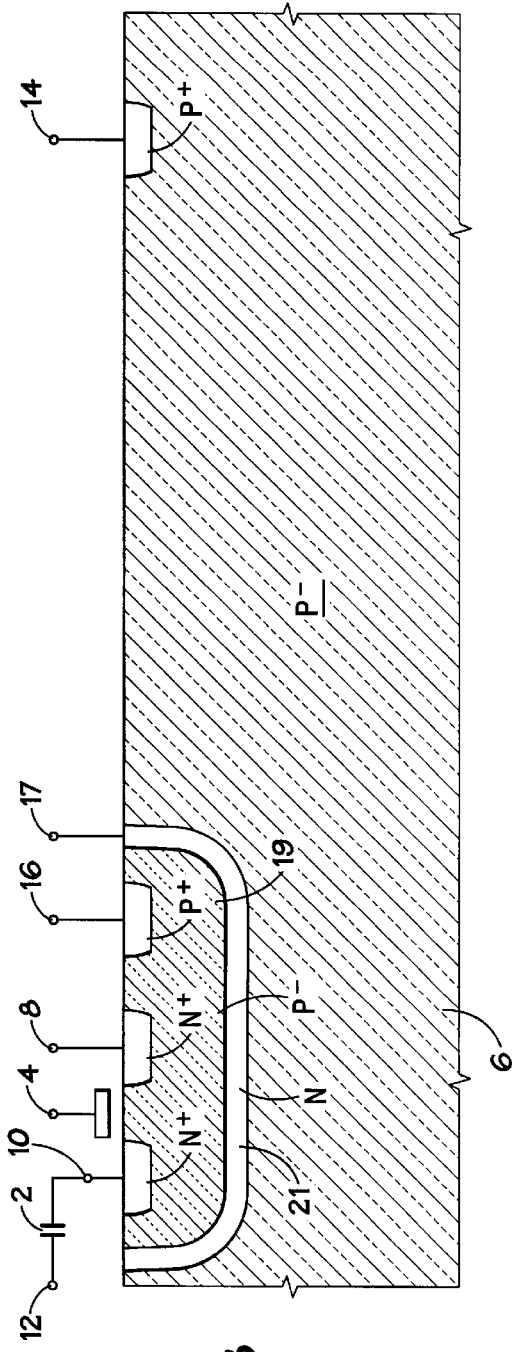
FIG. 2A
FIG. 2B

LOCAL SUBSTRATE PUMPING IN INTEGRATED CIRCUITS

FIELD OF THE INVENTION

This invention relates generally to the field of integrated circuit design, and more particularly to a method for locally charge pumping a substrate.

BACKGROUND OF THE INVENTION

It is sometimes advantageous to bias the substrate of an integrated circuit to a negative value. This is especially true of modern day Dynamic Random Access Memory (DRAM) devices. Typically DRAM devices contain circuits thereon which "charge pump" the substrate to a negative potential, without the need for an external negative voltage supply. The negative potential generated by a substrate charge pump is usually a function of the external supply. voltage which is introduced onto the chip (Vcc). For a Vcc of 5V, a negative substrate bias (Vbb) of perhaps −1.0V might be achieved. The maintenance of the negative potential is important to the functioning of the DRAM memory cells. Because the capacitors employed in the cells typically contain a bottom plate of polysilicon which is connected to an N-type region, biasing the P- substrate to a negative potential helps to keep the diode that is formed between the N-type region and the P- substrate in a reverse bias condition when either a logic '0' (typically 0.0V) or a logic '1' (typically Vcc) is stored on the capacitor. The reversed biased diode will reduce junction leakage to the substrate and therefore helps to effectively store the data state at the cell for a reasonable period of time.

However, the use of a negative substrate bias can limit the flexibility of a DRAM's other circuits. In particular, the negative substrate bias limits the voltages that can be employed in connection with the antifuse circuitry that appears in the peripheral circuitry on a DRAM. Typically, such antifuses are used as a type of destructive Read Only Memory (ROM), wherein the antifuses can be selectively destroyed, or "fused," to encode particular information onto the chip. Such antifuses can be used, for example, to store a DRAM's identification number, or to control the redundancy circuitry which re-routes signals away from known failing memory locations to functional auxiliary memory locations located elsewhere on the DRAM.

Techniques for fabricating an antifuse dell are well-known in the art, and a stylized cross-section of a typical antifuse cell is shown in FIG. 1. The antifuse 2 is serially connected to a programming transistor. Typically, the antifuse 2 is a capacitor, as shown in FIG. 1. The programming transistor gate 4, when biased to a high logic level, will cause a channel to form in the P- substrate 6 below the gate 4, thereby allowing the voltage at node 8 to be passed through the channel to lower antifuse plate 10. Although in reality the transistor gate 4 is separated from the substrate 6 by a dielectric, the dielectric is not shown in the stylized cross-section.

If the upper antifuse plate 12 is biased to a different voltage than lower antifuse plate 10, a potential difference will form across the dielectric between upper antifuse plate 12 and lower antifuse plate 10. If this potential difference exceeds the permissible field strength of the capacitor dielectric, the dielectric will break down and upper antifuse plate 12 and lower antifuse plate 10 will become fused together, creating a low-resistive path between the two plates.

A typical potential difference necessary to break down the capacitor dielectric may be, for example, 10V. In such a case, biasing upper antifuse plate 12 to 10V while grounding the lower antifuse plate 10 would be sufficient to short circuit the antifuse. However, design considerations may not favor the use of such a high voltage on the upper antifuse plate 12. Because the external supply voltage (Vcc) is typically 5V or less, the 10V signal will need to be generated by the use of a charge pump, if the 10V signal is to be generated on the chip itself. Charge pumping may consume an undesirable amount of power, and the appearance of the 10V signal at other locations on the chip may cause other reliability problems.

It is advantageous to be able to apply a voltage more consistent with normal chip operation to the upper antifuse plate 12, for example, 5V. However, this would mean that a −5V signal would need to be passed through the programming transistor to lower antifuse plate 10 to effect programming of the antifuse.

Although not shown in FIG. 1, a global substrate pumping circuit on DRAM devices is connected to the substrate 6 at node 14, creating a voltage on substrate 6 which is typically around −1.0V. The global substrate pumping circuit is typically connected to the substrate 6 at several locations laterally across the chip to provide a uniform distribution of the negative potential across the substrate 6. With a −1.7V potential on substrate 6, a −5V signal cannot be passed to lower antifuse plate 10, because the diode created between the N+region connected to node 8 and P- substrate 6 becomes forward biased before −5.0V can be achieved on the lower antifuse plate 10. That diode will be forward biased when the voltage on the P side of the diode (substrate 6) is a diode threshold voltage higher than the N side of the diode (node 8). Because a typical P-N diode threshold voltage is approximately +0.7V, the lowest voltage that could appear at node 8 without creating a forward biased diode is approximately −1.7V, if the substrate 6 is biased to −1.0V. Forward biasing of the diode in this fashion is detrimental to circuit operation because it will cause excessive amounts of power to be consumed, and will load down the passed signal to a voltage approaching that of the substrate voltage, thus prohibiting the destruction of the antifuse.

The disclosed invention alleviates this problem by providing a bias to the substrate which is local to the substrate area encompassing the antifuses.

SUMMARY OF THE INVENTION

According to the present invention, a method is disclosed wherein the voltage of a semiconducting substrate can be locally pumped to a voltage different than the global voltage of the semiconducting substrate. The method may employ the use of a well to isolate the locally pumped voltage from the global substrate voltage, or may be employed without the use of isolation, relying instead on the natural resistance of the substrate. The use of this method can be used in the design of antifuses which employ the use of negative potentials during the programming of the antifuse, thereby reducing the need for producing high positive potentials on the chip. Furthermore, the method can be used to adjust the threshold voltage of selected transistors without fabricating the selected transistors by a process different from other non-selected transistors. Also, the method can be used to reduce the effects of CMOS latch-up. A pumping circuit for producing a suitable localized voltage is also disclosed and claimed.

BRIEF DESCRIPTION OF THE DRAWINGS

FIG. 2A is a stylized cross-section of an antifuse circuit and describes the application of antifuse circuit aided by local substrate pumping.

FIG. 2B is a cross section of an alternative embodiment wherein the local substrate pump is isolated from the global substrate by a double-well structure.

DETAILED DESCRIPTION OF THE INVENTION

It will be appreciated that the present invention may take many forms and embodiments beyond those described herein. It is not intended that the specific embodiments that are described herein should limit the invention.

Figure 1:
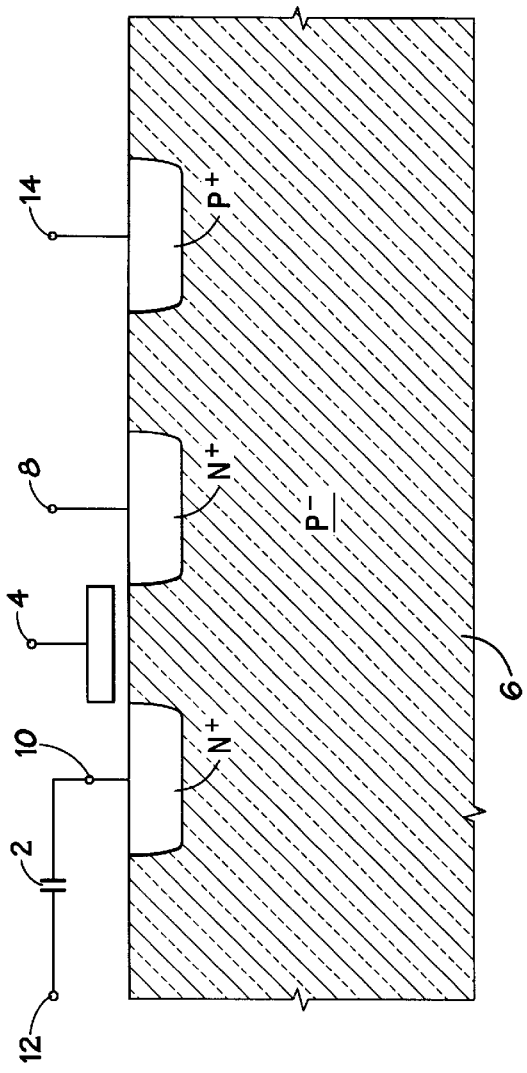
FIG. 1 is a stylized cross-section of a typical antifuse circuit.

Referring to FIG. 2A, the antifuse cell of FIG. 1 is again shown, except that the global substrate pumping circuit connected to node 14 has been laterally moved a significant distance from the antifuse cell, and a local substrate pumping circuit which is connected to node 16 has been situated in its place. While neither the local nor the global substrate pumping circuits are shown in FIG. 2A, their operation and design are discussed in more detail later. The function of the local substrate pumping circuit connected to node 16 is to provide a higher negative voltage in a portion of the substrate 6 which is local to node 16. For example, the local substrate pumping circuit might provide a voltage of −6.0V to node 16, which causes the substrate 6 in the vicinity of the antifuse to also become biased to −6.0V. While the vicinity in which the substrate 6 is sufficiently locally pumped will necessarily depend on factors to be described later, for illustration purposes dotted line 18 will demarcate the region inside of which the substrate 6 has been substantially biased to −6.0V.

When the substrate is biased by the local substrate pumping circuit in this fashion, the antifuse 2 may now be programmed using the biasing scheme discussed above: if a −6.0V signal is now placed onto node 8, the diode created by the N+region connected to node 8 would no longer be forward biased. In fact, if the local substrate voltage is −6.0V, and the diode threshold voltage is 0.7V, a voltage as low as −6.7V could be placed at node 8 without forward biasing the diode.

The local substrate pumping circuit and the global substrate pumping circuit can be active at the same time, without directly shorting to each other, because the substrate 6 is typically lightly P-doped crystalline silicon and is highly resistive, with a sheet resistance as high as 1,200 ohms/square. The resistance of the substrate can be modeled as part of a resistive-capacitive network 24, where the substrate resistance is modeled by resistors 20 and substrate capacitance is modeled by capacitors 22. Because of the substrate resistance between the global substrate pumping circuit connected to node 14 and the local substrate pumping circuit connected to node 16, the potential in the substrate between nodes 16 and 14 will change gradually, or "spread," if both circuits are active. For example, if node 14 is biased to −2.0V by the global substrate pumping circuit, and node 16 is biased to −6.0V by the local substrate pumping circuit, the substrate potential would be −4.0V at some point approximately half-way between node 16 and 14. Moreover, this difference in potential between nodes 16 and 14 will necessarily cause some amount of current leakage between the two nodes, depending primarily on the sheet resistance of the substrate 6. For these reasons, the region in which the substrate can be locally pumped to a satisfactorily lower voltage than that produced by the global substrate pumping circuit will necessarily not be precisely defined. The primary factor governing the extent to which a local region of satisfactory size can be achieved will be the distance between node 16 and other nodes 14 which will likely be located at several locations laterally throughout the chip's surface. For this reason, a chip designer desiring to use the disclosed method should be satisfied that the potential drop that occurs within dotted line 18 (due to spreading) will still be satisfactory to effect the desired operation of the circuits contained within dotted line 18. Also, the circuit designer should be satisfied that spreading will not adversely affect those circuits outside of dotted line 18 which do not require localized substrate pumping.

Referring to FIG. 2B, another embodiment is disclosed wherein the local substrate pumping circuit is isolated from the global substrate pumping circuit by the use of a double-well structure. In this embodiment, the circuits that are to benefit from a higher negative substrate voltage are contained within a double-well structure, comprising N-well 21 and P-well 19. Because the P-well 19 is contained entirely within N-well 21, the N-well will act to electrically isolate the P-well 19 from the substrate 6. While N-well 21 may be left floating (i.e., no voltage is connected to node 17), it is desirable to expressly provide a positive bias at node 17, e.g., the power supply voltage, to minimize leakage between P-well 19 and substrate 6. When N-well 21 is biased to a positive voltage, both P-well 19 and substrate 6 will be reversed biased with respect to the N-well, thus reducing leakage current to a minimum. By the use of the alternative embodiment, P-well 21 can be biased to the desired negative voltage (e.g., −6.0V) by a local substrate pumping circuit to be connected at node 16, while the substrate 6 can be biased to a different voltage (e.g., −1.0V) by the global substrate pumping circuit to be connected at node 14.

The embodiment of FIG. 2B allows the voltage to which the P-well 19 is biased to be more precisely maintained. Furthermore, because there is little or no leakage between the P-well 19 and the substrate 6, the voltage within P-well 19 will remain constant and will not "spread" into the substrate. This is because the reversed biased N-well 21 essentially disconnects the resistive-capacitive network 24 between P-well 19 and substrate 6, as described in the preferred embodiment. Moreover, the reduction in leakage between P-well 19 and substrate 6 will preserve power. However, this embodiment requires additional steps to be added into a device's manufacturing flow to form the N-well 21 and P-well 19, which will necessarily increase processing complexity and cost. Furthermore, the need to bias the N-well 21 may add to the complexity of the design and take up space which could be used for other circuitry.

As a practical matter, both the local substrate pumping circuit and the global substrate pumping circuit may not need to be simultaneously active for a given chip application. For example, if an identification code is to be encoded in a bank of antifuses, the global substrate pumping circuit can be disengaged and nodes 14 will be left to "float."

Regardless of whether the global substrate pumping circuit is disengaged, using the local substrate pumping circuit has certain advantages over global substrate pumping generally. Because the substrate has an inherent capacitance as modeled by capacitors 22, it will necessarily take time to pump the entire substrate to a given voltage. For this reason, satisfactory localized substrate pumping is much faster and much more controllable, because the resistances and capacitances in the localized region are reduced when compared to the entire chip. Furthermore, since only a localized region needs to be pumped, less current will be consumed by the pumping circuitry, thus conserving power and providing for efficient chip operation.

Figure 3A:
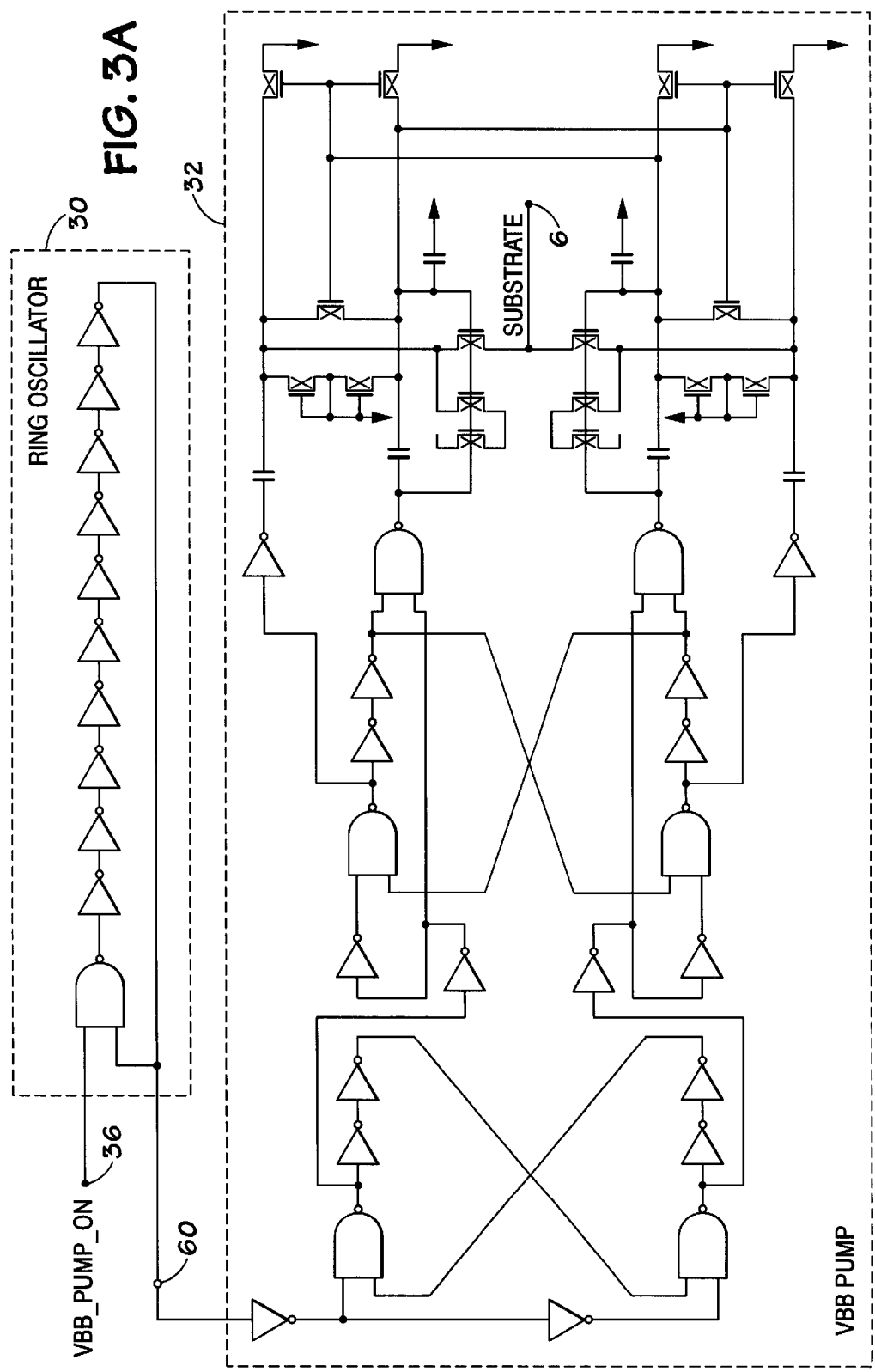
FIG. 3A is a schematic of the ring oscillator and Vbb pump portion of the substrate pumping circuitry.
Figure 3B:
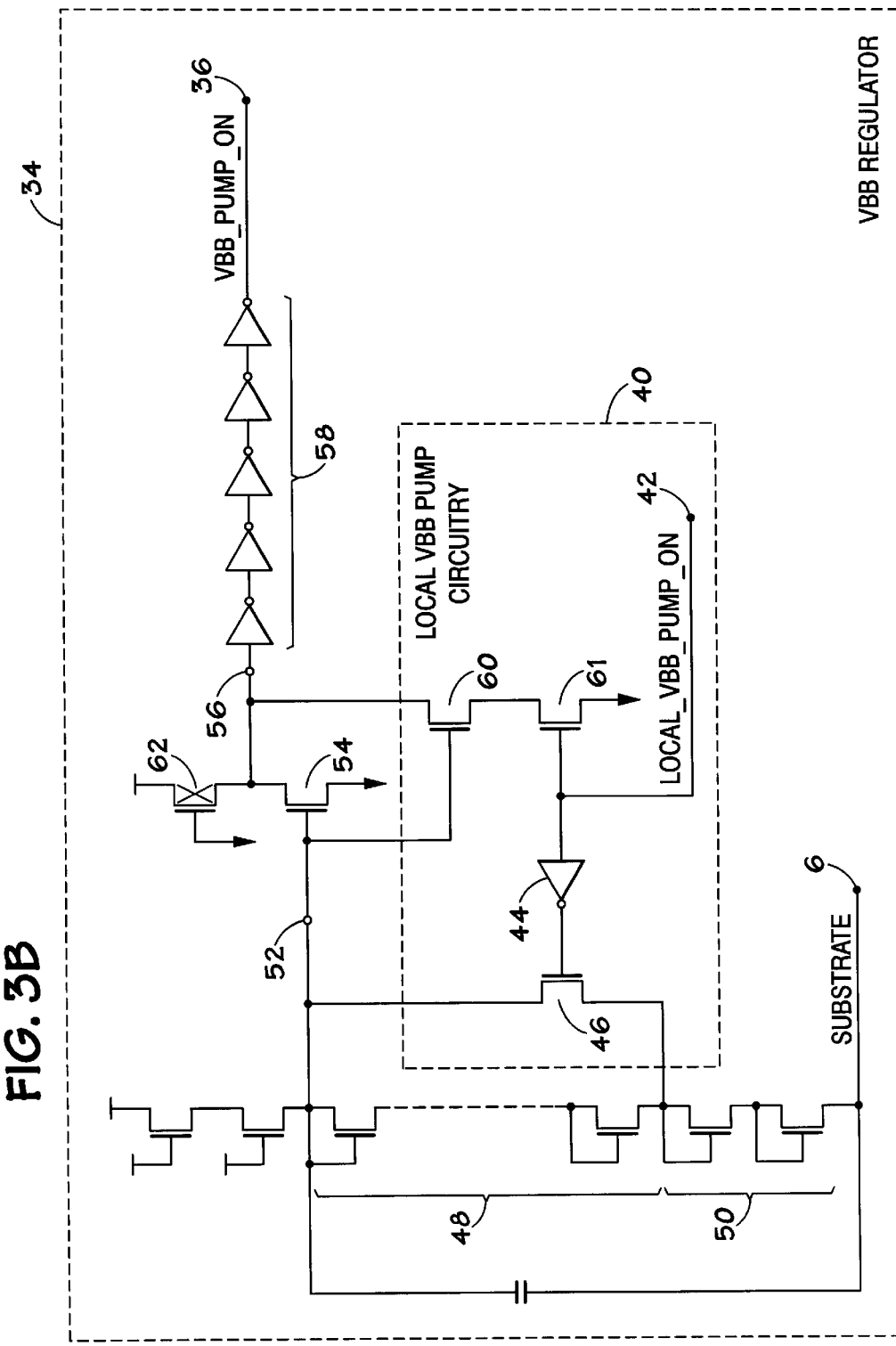
FIG. 3B is a schematic of the Vbb regulator portion of the substrate pumping circuitry.

The circuitry that can be used to perform localized charge pumping is shown in FIGS. 3A and 313. The circuitry is divided into three stages: the ring oscillator 30 (FIG. 3A), the Vbb pump 32 (FIG. 3A) and the Vbb regulator 34 (FIG. 3B). The VBB_PUMP_ON 36 signal is connected to the input of the ring oscillator 30. The desired negative substrate potential is generated by the Vbb pump 32 which sends its output to the substrate 6, that is detected by the Vbb regulator 34. With the exception of the local Vbb pump circuitry 40, the remainder of FIG. 3B is prior art whose operation will be known to one reasonably skilled in the art.

In the preferred embodiment, a DRAM utilizing the local charge pumping technique would use separate pumping circuits, one for local substrate pumping (such as would be connected to node 16 in FIG. 2A) and one for global substrate pumping (such as would be connected to node 14 in FIG. 2A). The local substrate pumping circuit would be designed per FIGS. 3A and 3B with no additions or deletions. The global substrate pumping circuit would also be designed per FIGS. 3A and 3B, with the exception that the LOCAL_VBB_PUMP$_{13}$ ON 42 signal would be hardwired to ground.

Referring to FIGS. 3A to 3B, the operation of the global substrate pumping circuit is described. Hardwiring the LOCAL_VBB_PUMP_ON 42 signal to ground in the global substrate pumping circuit will cause the output of inverter 44 to go to a logic '1', which will turn on transistor 46. This has the effect of shorting transistors 48 from the circuit. Transistors 48 and 50, by virtue of their wiring, effectively constitute a diode chain, wherein each transistor acts as a diode. The number of diodes in the diode chain will effectively control the value of substrate 6, as will be apparent shortly. Assuming that substrate 6 is currently more negative than the target Vbb value for the global substrate pumping circuit (e.g., more negative than −1.0V), the transistors 50 (the only diodes in the diode chain) will conduct if the potential between node 52 and substrate 6 is higher than the sum of the diode threshold voltages of the diodes (transistors 50 in the global substrate pumping circuit). When transistors 50 conduct in this fashion, they pull node 52 to a value below the threshold voltage of transistor 54, preventing transistor 54 form turning on and biasing node 56 to a logic '0'. Because inverters 58 are odd in number, VBB_PUMP_ON 36 will be logic '0' and cause the ring oscillator 30 to disengage, thereby disabling the Vbb pump 32 momentarily. When the Vbb pump is disengaged, substrate 6 cease to be pumped to a further negative voltage, and Vbb will begin to drift to a higher voltage. When substrate 6 drifts above the target Vbb value, transistors 50 will no longer be forward biased and will no longer conduct, causing node 52 to be pulled to a voltage higher than the threshold voltage of transistor 54, turning it on. Turning on transistor 54 pulls node 56 to a logic '0', and causes inverters 58 to produce a logic '1' signal at VBB_PUMP_ON 36. When a logic '1' is sent into the ring oscillator 30, the oscillator will start to oscillate, producing an oscillating square wave at node 60 which will in turn cause the Vbb pump 32 to engage. Thus, the Vbb pump will once again start producing a lower voltage at substrate 6, causing transistor 50 to conduct once again. As this cycle continues, substrate 6 is effective kept pumped to its target value of −1.0V.

The local substrate pumping circuit functions in much the same way, except that a lower substrate 6 voltage is produced. When the LOCAL_VBB_PUMP_ON signal 42 is logic '1', the output of inverter 44 will be at logic '0' and transistor 46 will be off. The effect is to bring transistors 48 back into the diode chain, and allows a much lower negative voltage to be produced at substrate 6. The lower negative voltage results because there are now more diode threshold voltages that must be overcome by the potential to be formed between node 52 and substrate 6. Also, since LOCAL_VBB_PUMP_ON is at a logic '1', N-channel transistor 60 will be turned on or off based on the voltage on node 52. In effect, transistors 60 and 54 are in parallel, and the effective drive of transistors 54 and 60 together can overpower P-channel pull-up transistor 62, so that node VBB_PUMP_ON will remain high longer. This will cause the local substrate pump to stay on longer and the local VBB value will therefore be pumped to a more negative value. (FIG. 3B)

For most chip operations, the local substrate pumping circuit will function similarly to the global substrate pumping circuit and will produce a moderately negative substrate voltage. In other words, the LOCAL_VBB_PUMP_ON signal 42 will be set at a logic '0' level. However, during certain chip operations such as identification encoding or redundancy programming which require the programming of antifuses, the local substrate pumping circuit will be engaged. In other words, the signal LOCAL_VBB_PUMP_ON 42 will be set at a logic '1' level. Where the local substrate pumping circuit contacts the substrate 6, a localized region in substrate 6 will become pumped to a lower voltage (e.g., −6.0V) than the rest of substrate 6 which is connected to global substrate pumping circuit (e.g. −1.0V), as described above. Because the LOCAL_VBB_PUMP_ON signal 42 is hardwired to ground in the global substrate pumping circuit, the changing of the LOCAL_VBB_PUMP_ON signal will not affect the global substrate pumping circuit, only the local substrate pumping circuit.

Figure 4:
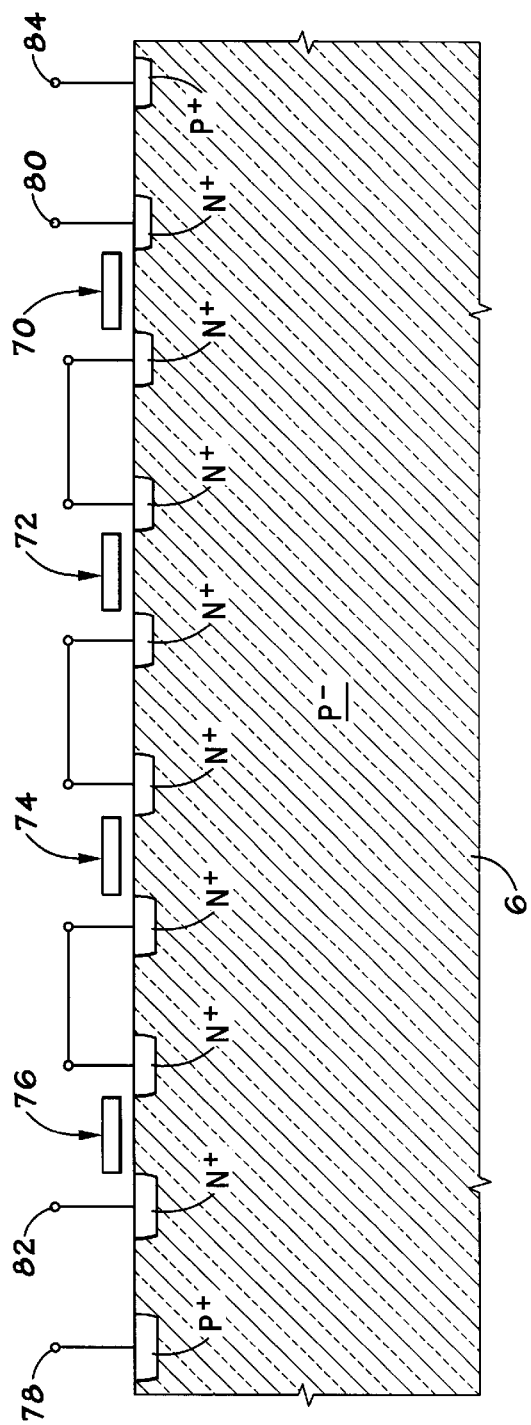
FIG. 4 is a stylized cross-section of a series of N-channel transistors and illustrates the use of a local substrate pump to adjust the body effect in a N-channel transistor.

The present invention may also be used to adjust an undesirable phenomenon in integrated circuits known as the body effect, which is explained with reference to FIG. 4. Several N-channel transistors (70, 72, 74, and 76) are connected serially between the power supply 80 and ground 82. It is normally preferable for operational reasons that all transistors in this configuration have the same threshold voltage. However, the body effect will cause the transistors that are nearest to the power supply 80 (e.g., transistor 70) to have a higher threshold voltage than the other transistors. More specifically, the threshold voltage of a given transistor will be dictated by the following equation: $Vt=Vt0+[(2*Vsb*\epsilon*P)^{1/2}/C]$; where Vt is a given transistor's threshold voltage, Vt0 is the native threshold voltage of the transistor absent the body effect, Vsb is the potential difference from the source of the transistor to the substrate, P is the doping level in the substrate, ε is pennitivity of crystalline silicon, and C is the unbiased capacitance of the diode formed between the source and the substrate. Thus, because the source of transistor 70 in FIG. 4 is connected to power supply 80, Vsb will be relatively large and cause the threshold voltage of transistor 70 to be higher than its native value (Vt0). Because some voltage from the power supply 80 will be dropped across transistor 70, Vsb for transistor 72 will not be as high but will still cause some increase in the threshold voltage of transistor 72, and so on down the chain of transistors.

With reference still to FIG. 4, a local substrate pumping circuit is connected to node 78 to help adjust the body effect. Because the local substrate pumping circuit will produce a higher negative substrate voltage, transistors within the local region will experience an increase in their threshold voltages, because the more negative substrate voltage dictates that higher gate voltages will be needed to form a channels in the transistors, thus allowing them to turn "on." By capitalizing on the "spread" of the voltage produced in substrate 6 between node 78 and the global substrate pumping circuit connected to node 84, the threshold voltages of transistors 70, 72, 74 and 76 can be brought more closely in line with one another.

However, because the amount of spreading in the substrate may be difficult to determine, it may be difficult in FIG. 4 to determine where to locate the transistors to maximize the benefits of the spread in the substrate voltage. Therefore, it may be desirable to use the double-well alternative embodiment described earlier to isolate each transistor configured in the manner shown in FIG. 4 in its own P-well, each individual P-well being fed by its own local substrate pumping circuit. In this manner, each transistor threshold voltage could be precisely controlled by its own local substrate pumping circuit to produce threshold voltages in transistors 70, 72, 74 and 76 that are nearly uniform.

Figure 5:
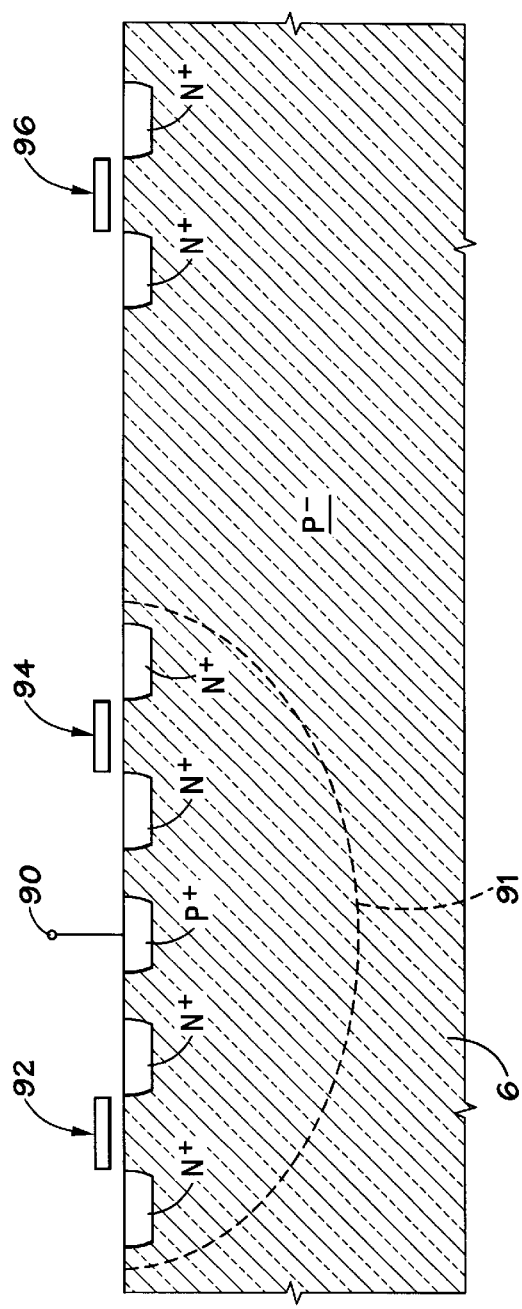
FIG. 5 is a cross section of several N-channel transistors and illustrate the use of a local substrate pump to optimize a given transistor's threshold voltage.

More generally, even absent any change in transistor threshold voltage due to the body effect, a local substrate pump can be used to change the native threshold voltage of transistors. For example, FIG. 5 shows three N-channel transistors 92, 94, and 96. Transistors 92 and 94 are in the vicinity of node 90 which is connected to a local substrate pumping circuit and are within the localized biased region 91, while transistor 96 is well outside of the biased region 91. The three transistors 92, 94, and 96 are otherwise completely identical: they have been fabricated using the same process and have the same native threshold voltages. However, because of the increased substrate bias produced by the local substrate pumping circuit, the threshold voltage of transistors 92 and 94 will be higher than that of transistor 96. Therefore, local substrate pumping allows the design engineer to fabricate a transistor of a single polarity type (e.g., N-channel transistors) which has two different threshold voltages, depending on the transistor's location with respect to node 90. This is advantageous over the prior art in that transistors of differing threshold voltages can be produced electrically, without the need of producing transistors of a single polarity type on the same chip that require differing processing considerations. Of course, even in designs that do not expressly call for two different threshold voltages for transistors of the same polarity, the embodiment shown in FIG. 5 can be used more generally to optimize a transistor's threshold voltage in a given circuit. This method can be used to fine tune selected N-channel transistors whose threshold voltages are sensitive after fabrication of the completed chip product by changing the substrate voltage in a localized region. Furthermore, while most embodiments have discussed the production of localized region than is more negatively biased than the substrate globally, the technique could also be used to create a local region which is less negatively biased than the substrate.

Threshold voltage adjustment could also benefit from the use of the double well alternative embodiment.

Figure 6:
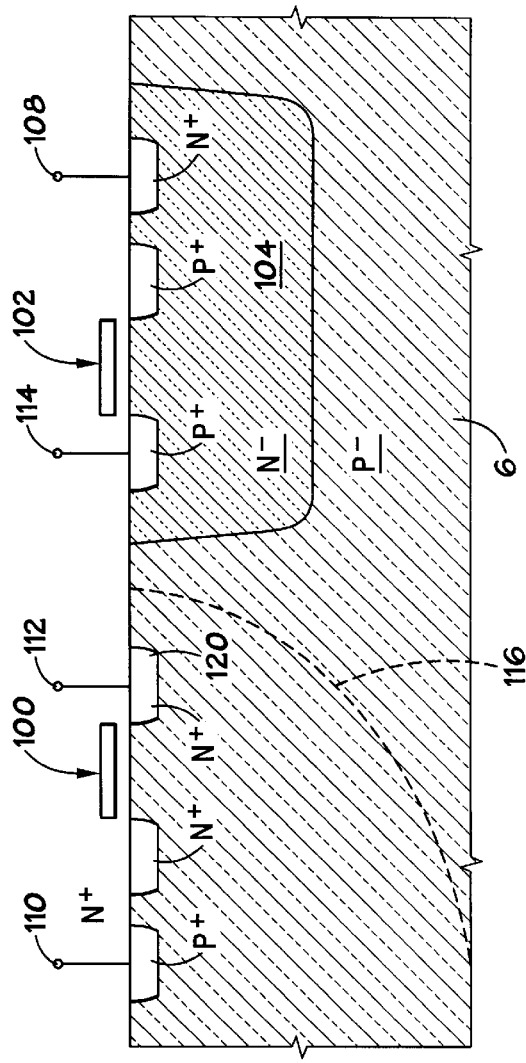
FIG. 6 is a cross section of a typical CMOS structure and illustrates the use of a local substrate pump to reduce latch-up sensitivity.

Another use of the present invention is its ability to reduce latch-up in basic Complementary Metal-Oxide-Semiconductor (CMOS) circuitry, such as output buffers and sense amp circuitry. The operation of latch-up can be explained with reference to FIG. 6. FIG. 6 shows a CMOS structure comprised of a N-channel transistor 100 and a P-channel transistor 102. In a DRAM, the N-well 104 would normally be connected to the power supply voltage by node 108, while the substrate 6 would be pumped globally to a moderately negative voltage (e.g., −10V). Moreover, signals could be placed at nodes 112 and 114. Thus, a parasitic P-N-P-N structure arises which is comprised of nodes 114, 108, 6, and 112 respectively. Normally, the parasitic P-N-P-N structure will not cause a problem, as it will not usually be inadvertently turned on. However, if the structure is turned on, the structure will "latch," thus causing the power supply node 108 to short to node 112, which is likely connected to ground.

A way to turn on the parasitic structure is by forward biasing the diode 120 which is formed between node 112 and substrate 6. If node 112 is grounded, diode 120 is normally reversed biased, because the substrate 6 is pumped to a negative voltage. However, a sudden power surge in the device could cause the global substrate voltage to fluctuate upward, and could in a extreme case rise above 0V. If this happens, diode 120 could become forward biased, thus gating the P-N-P-N structure and causing latch-up.

To guard against this effect, a local substrate pumping circuit could be attached to node 110. This would have the effect of lowering the substrate voltage in the vicinity of the latch-up sensitive circuit, and reducing the circuit's latch-up sensitivity. By producing a lower substrate voltage within 116, diode 120 will be less likely to become forward biased in the event of a disturbance in the global substrate voltage.

Although reduction of latch-up could also benefit from the use of the double well alternative embodiment, that embodiment might be unnecessary. This is because N-well 104 will provide much the same isolating function as does N-well 21 in the alternative embodiment (see FIG. 2B).

While the foregoing discussion has focused DRAM technologies, the disclosed invention should not be narrowly construed to cover only DRAM products. Furthermore, the use of localized substrate pumping should not be narrowly construed to apply only to substrates which are generally negatively biased. In fact, the method of localized charge pumping to produce localized regions in the substrate could be used in conjunction with technologies that require grounded substrates as well. Moreover, the basic methods disclosed herein could also be used to produce local positive regions in the substrate in appropriate situations.

What is claimed is:

1. A method for locally biasing a bulk semiconducting substrate, comprising:
   (a) connecting a global substrate charge pump to the bulk semiconducting substrate at a plurality of nodes, the bulk semiconducting substrate being one of a p-type or an n-type substrate;
   (b) enabling the global substrate charge pump to produce a global voltage on the bulk semiconducting substrate;

(c) connecting a local substrate charge pump to the bulk semiconducting substrate at a node; and (d) enabling the local substrate charge pump to produce in the vicinity of the node a localized voltage in the bulk semiconducting substrate which is different than and independent of the global voltage of the bulk semiconducting substrate.

2. The method of claim 1, wherein the localized voltage is more negative than the global voltage of the substrate.

3. The method of claim 1, wherein the localized voltage is more positive than the global voltage of the substrate.

4. The method of claim 1, wherein the localized voltage is produced by means of a charge pump.

5. A method for operating an integrated circuit, comprising:

(a) charge pumping a bulk substrate globally to a first voltage; and (b) charge pumping a locally based region in the bulk semiconducting substrate to a second voltage that is different from and independent of the first voltage.

6. The method of claim 5, wherein the second voltage is more negative than the first voltage.

7. The method of claim 5, wherein the second voltage is more positive than the first voltage.

8. The method of claim 5, wherein the locally biased region of the substrate is isolated from the first voltage by means of a well which is doped of opposite polarity to the semiconducting substrate.

9. The method of claim 5, wherein the integrated circuit is a DRAM.

10. A method for operating a DRAM, comprising:

(a) globally charge pumping the substrate of the DRAM to a first voltage; and (b) locally charge pumping a localized region of the substrate to a second voltage.

11. A DRAM comprising:

(a) means for locally pumping the substrate to produce a first voltage in a localized region of the substrate; and (b) means for globally pumping the substrate to produce a second voltage in other portions of the substrate substantially outside of the localized region.

12. A method for adjusting the threshold voltage of a transistor formed in a bulk semiconducting substrate, comprising the step of:

adjusting the threshold voltage of the transistor by biasing a localized region of the bulk semiconducting substrate to a voltage in the vicinity of the transistor that is different from the global voltage of the bulk semiconducting substrate.

13. The method of claim 12, wherein the localized region is biased by means of a charge pump.

14. A method for adjusting the body effect in a plurality of N-channel transistors connected in series between a positive power supply node and a ground node, comprising locally pumping the "bulk semiconducting" substrate to a potential more negative than the global voltage of the "bulk semiconducting" substrate in the vicinity of those N-channels transistors nearest to the ground node, thereby increasing the threshold voltages of those N-channel transistors.

15. A method for adjusting the body effect in a plurality of N-channel transistors connected in series between a positive power supply node and a ground node, comprising:

(a) isolating at least one N-channel transistor from a P-doped substrate by means of an N-well; and (b) charge pumping P-doped silicon inside the well to a voltage lower than that of the global substrate voltage, thereby increasing the threshold voltage of the N-channel transistor such that its threshold voltage is made substantially equal to the other N-channel transistors in the series.

16. A method for reducing latch-up sensitivity in a CMOS circuit, comprising the step of:

reducing latch-up sensitivity of the CMOS circuit by biasing a localized region of a bulk semiconducting P-doped substrate to a voltage in the vicinity of latch-up sensitive N-channel transistors that is more negative than the global voltage of the bulk semiconducting substrate.

17. The method of claim 16, wherein the localized region is biased by means of a charge pump.

18. An integrated circuit, comprising:

(a) a local charge pumping circuit used to produce a first voltage in a localized region of a doped substrate; and (b) a global charge pumping circuit used to produce a second voltage in all other portions of the substrate substantially outside of the localized region.

19. The integrated circuit of claim 18, wherein the integrated circuit is a DRAM.

20. The integrated circuit of claim 18, further comprising a well used to isolate the localized region from the second voltage.

21. A method of adjusting a threshold voltage of a transistor fabricated in a bulk semiconducting substrate, the method comprising the steps of:

(a) applying a first voltage to the bulk semiconducting substrate; and (b) applying a second voltage in a region of the bulk semiconducting substrate in which the transistor is located, the second voltage being different than the first voltage.

22. The method, as set forth in claim 21, wherein step (a) comprises the step of:

generating the first voltage using a charge pump fabricated on the semiconducting substrate.

23. The method, as set forth in claim 21, wherein step (b) comprises the step of:

generating the second voltage using a charge pump fabricated on the semiconducting substrate.

24. A method of adjusting a threshold voltage of a transistor fabricated in a bulk semiconducting substrate, the method comprising the steps of:

(a) applying a first voltage to the bulk semiconducting substrate at a plurality of first nodes, each of the plurality of first nodes being located at least a first distance from the transistor; and (b) applying a second voltage to the bulk semiconducting substrate at a second node, the second node being located a second distance from the transistor, the second voltage being different than the first voltage, and the second distance being shorter than the first distance.

25. The method, as set forth in claim 24, wherein step (a) comprises the step of:

generating the first voltage using a charge pump fabricated on the semiconducting substrate.

26. The method, as set forth in claim 24, wherein step (b) comprises the step of:

generating the second voltage using a charge pump fabricated on the semiconducting substrate.

27. A method of biasing a region of a semiconducting substrate, the method comprising the steps of:

(a) fabricating at least one transistor in the region;

(b) locating a first node in the region;

(c) locating a second node outside the region, the second node and the first node being isolated from one another only by the semiconducting substrate;

(d) applying a first voltage to the first node; and (e) applying a second voltage to the second node, the second voltage being different than the first voltage.

28. The method, as set forth in claim 27, wherein step (d) comprises the step of:

generating the first voltage using a charge pump fabricated on the semiconducting substrate.

29. The method, as set forth in claim 27, wherein step (e) comprises the step of:

generating the second voltage using a charge pump fabricated on the semiconducting substrate.

30. A method of adjusting a body effect in a plurality of transistors fabricated in a first region of a bulk semiconducting substrate and coupled in series between a power supply node and a ground node, the method comprising the steps of:

(a) applying a first voltage in the first region of the bulk semiconducting substrate; and (b) applying a second voltage in a second region of the bulk semiconducting substrate located outside the first region, the first voltage being different than the second voltage to create a voltage gradient within the region, the voltage gradient adjusting the threshold voltages of the plurality of transistors.

31. The method, as set forth in claim 30, wherein step (a) comprises the step of:

generating the first voltage using a charge pump fabricated on the semiconducting substrate.

32. The method, as set forth in claim 30, wherein step (b) comprises the step of:

generating the second voltage using a charge pump fabricated on the semiconducting substrate.

33. A method for adjusting the threshold voltage of a transistor formed in a bulk semiconducting substrate, comprising the step of:

adjusting the threshold voltage of the transistor by biasing a localized region of the bulk semiconducting substrate to a voltage in the vicinity of the transistor that is different from and independent of a global voltage of the bulk semiconducting substrate.

34. A method of adjusting a threshold voltage of a transistor fabricated in a bulk semiconducting substrate, the method comprising the acts of:

(a) applying a first voltage to the bulk semiconducting substrate in a region of the bulk semiconducting substrate having a given doping type; and (b) applying a second voltage in a region of the bulk semiconducting substrate having the given doping type in which the transistor is located, the second voltage being different than the first voltage.

35. A method of adjusting a threshold voltage of a transistor fabricated in a bulk semiconducting substrate, the method comprising the acts of:

(a) applying a first voltage to a plurality of first nodes located in a region of the bulk semiconducting substrate having a first doping type, each of the plurality of first nodes being located at least a first distance from the transistor; and (b) applying a second voltage to second node in the region of the bulk semiconducting substrate having the first doping type, the second node being located a second distance from the transistor, the second voltage being different than the first voltage, and the second distance being shorter than the first distance.

36. A method of biasing a bulk semiconducting substrate, the method comprising the acts of:

(a) fabricating at least one transistor in a first region of the bulk semiconducting substrate, the first region being of a first doping type;

(b) locating a first node in the first region;

(c) locating a second node in a second region of the bulk semiconducting substrate, the second region being of the first doping type and being located outside of the first region, the second node and the first node being isolated from one another only by the semiconducting substrate;

(d) applying a first voltage to the first node; and (e) applying a second voltage to the second node, the second voltage being different than and independent of the first voltage.

37. A method of adjusting a body effect in a plurality of transistors formed in a bulk semiconducting substrate, the method comprising the acts of:

(a) providing a plurality of transistors fabricated in a first region of the bulk semiconducting substrate and coupled in series between a power supply node and a ground node, the first region being of a first doping type;

(b) applying a first voltage in the first region; and (c) applying a second voltage in a second region of the bulk semiconducting substrate, the second region being of the first doping type and being located outside of the first region, the first voltage being different than the second voltage to create a voltage gradient within the regions, the voltage gradient adjusting the threshold voltages of the plurality of transistors.

38. A method for locally biasing a bulk semiconducting substrate, the method comprising the acts of:

(a) providing a bulk semiconducting substrate having a global region being of a given doping type and having a local region being of the given doping type, the local region being located within the global region;

(b) coupling a source of a first voltage to the global region; and (c) coupling a source of a second voltage to the local region, the second voltage being different from the first voltage.

39. The method, as set forth in claim 38, wherein the act (a) comprises the act of:

enabling the source of the first voltage to generate a global voltage in the global region.

40. The method, as set forth in claim 39, wherein the act (b) comprises the act of:

enabling the source of the second voltage to generate a local voltage in the local region of the global region, the local voltage being different from the global voltage.

41. The method, as set forth in claim 40, wherein the local voltage is independent of the global voltage.

42. A method of affecting localized body effect in a plurality of transistors fabricated on a bulk semiconducting substrate, the method comprising the acts of:

(a) providing a bulk semiconducting substrate having a first plurality of transistors located in a first subregion of a global region of the bulk semiconducting substrate and having a second plurality of transistors located in a second subregion of a global region of the bulk semiconducting substrate;

(b) providing a global voltage to the global region; and (c) providing a local voltage to a local region of the global region, the local voltage being different than and independent of the global voltage.

43. The method, as set forth in claim 42, wherein the local region comprises the second subregion, and wherein the local voltage is selected to provide a voltage threshold for the second plurality of transistors that is substantially equal to a voltage threshold for the first plurality of transistors.

44. The method, as set forth in claim 42, wherein the local region comprises the second subregion, and wherein the local voltage is selected to provide a voltage threshold for the second plurality of transistors that is different from a voltage threshold for the first plurality of transistors.

* * * * *